United States Patent [19]
Scott

[11] Patent Number: 5,102,811
[45] Date of Patent: Apr. 7, 1992

[54] HIGH VOLTAGE BIPOLAR TRANSISTOR IN BICMOS

[75] Inventor: David B. Scott, Plano, Tex.

[73] Assignee: Texas Instruments Incorporated, Dallas, Tex.

[21] Appl. No.: 614,066

[22] Filed: Nov. 13, 1990

Related U.S. Application Data

[62] Division of Ser. No. 496,396, Mar. 20, 1990, abandoned.

[51] Int. Cl.⁵ .......................................... H01L 21/265
[52] U.S. Cl. ...................................... 437/31; 437/34;
437/40; 437/57; 357/34; 357/43
[58] Field of Search ............... 357/34, 35, 43; 437/31,
437/34, 40, 57

[56] References Cited

U.S. PATENT DOCUMENTS

| | | | |
|---|---|---|---|
| 3,971,059 | 7/1976 | Dunkley | 357/35 |
| 4,769,337 | 9/1988 | Maeda | 437/34 |
| 4,816,423 | 3/1989 | Havermann | 437/31 |
| 4,868,135 | 9/1989 | Ogura et al. | 437/43 |
| 4,879,255 | 11/1989 | Deguchi et al. | 437/31 |
| 4,902,639 | 2/1990 | Ford | 437/31 |
| 4,950,616 | 8/1990 | Kahng et al. | 437/31 |
| 4,957,874 | 9/1990 | Soejima | 437/31 |
| 4,965,220 | 10/1990 | Iwasaki | 437/31 |

FOREIGN PATENT DOCUMENTS

| | | | |
|---|---|---|---|
| 63-133662 | 6/1988 | Japan | 437/31 |
| 1-158765 | 6/1989 | Japan | 437/34 |
| 2143086 | 1/1985 | United Kingdom | 437/34 |

Primary Examiner—Brian E. Hearn
Assistant Examiner—Kevin M. Picardat
Attorney, Agent, or Firm—Douglas A. Sorensen; Richard L. Donaldson; William E. Hiller

[57] ABSTRACT

The described embodiments of the present invention show a high voltage bipolar transistor integrated into a bipolar complementary metal oxide semiconductor integrated circuit. The high voltage transistor is fabricated using the available processing steps for fabricating other components in more standard BiCMOS processes. The collector of the transistor is formed using a buried N type region in a P substrate. A P well, rather than the conventional N well is formed above the buried N layer. The collector contact to the buried N layer is fabricated so as to surround the P well to provide a separate base region. A highly doped P type base region is formed with a P+ contact to this region. An N+ emitter is formed by out diffusion from a heavily doped polycrystalline silicon layer formed in contact with the base region. By providing the lightly doped P well as an interface between the collector and the base, the breakdown voltage of the collector/base junction is substantially raised and thus the breakdown voltage from the collector to the emitter is also raised. A transistor thus fabricated is appropriate for high voltage applications.

9 Claims, 12 Drawing Sheets

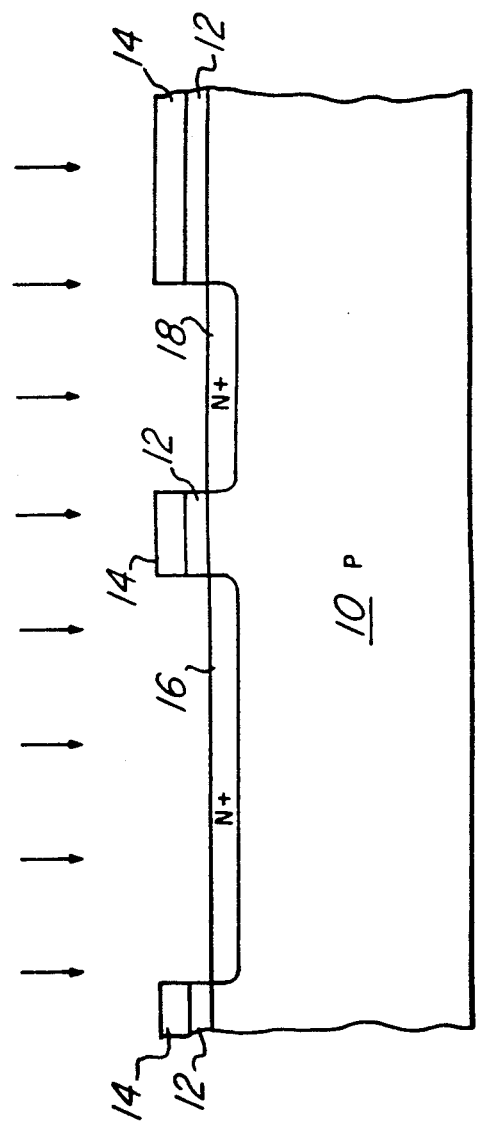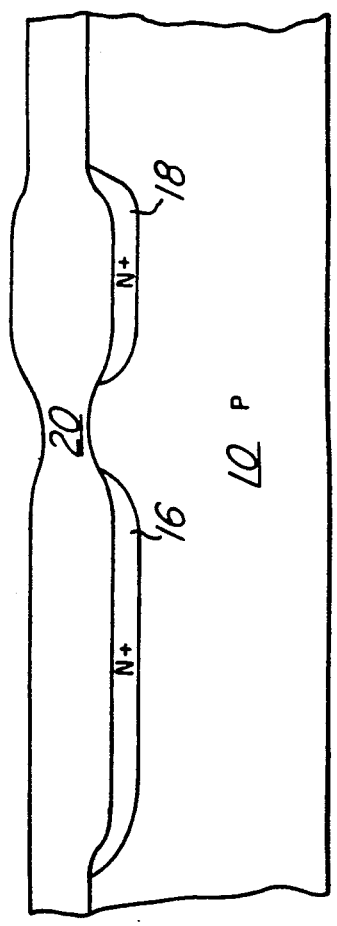

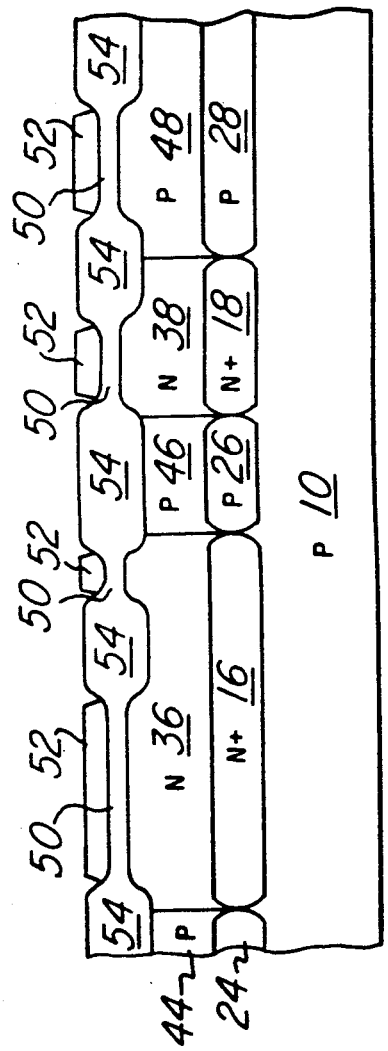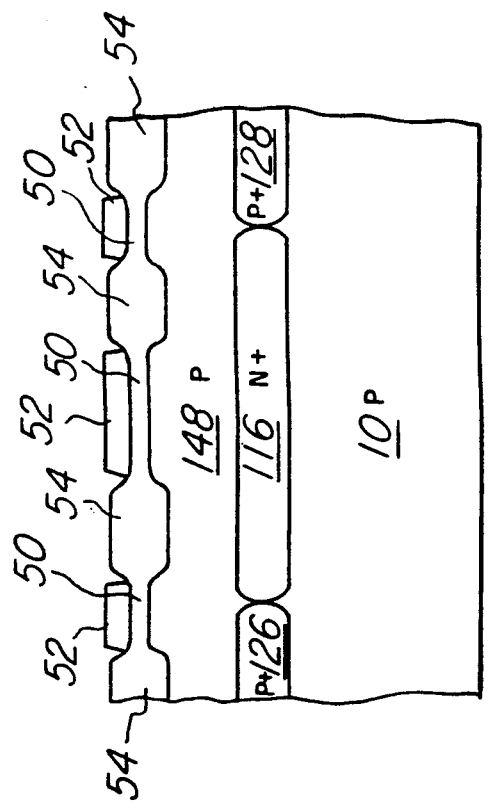
Fig.8a
Fig.8b

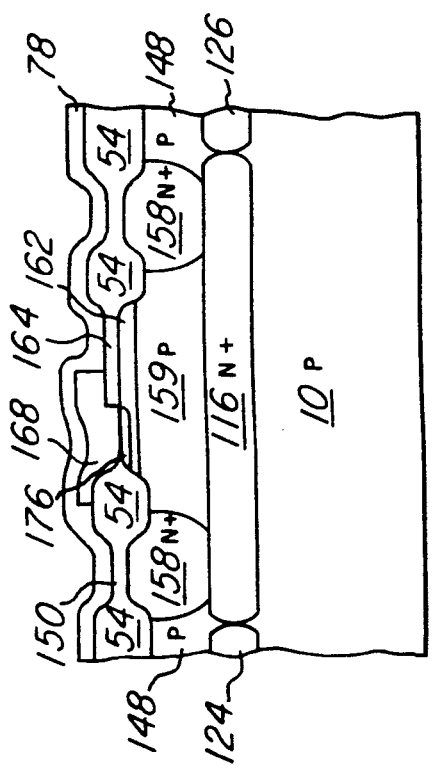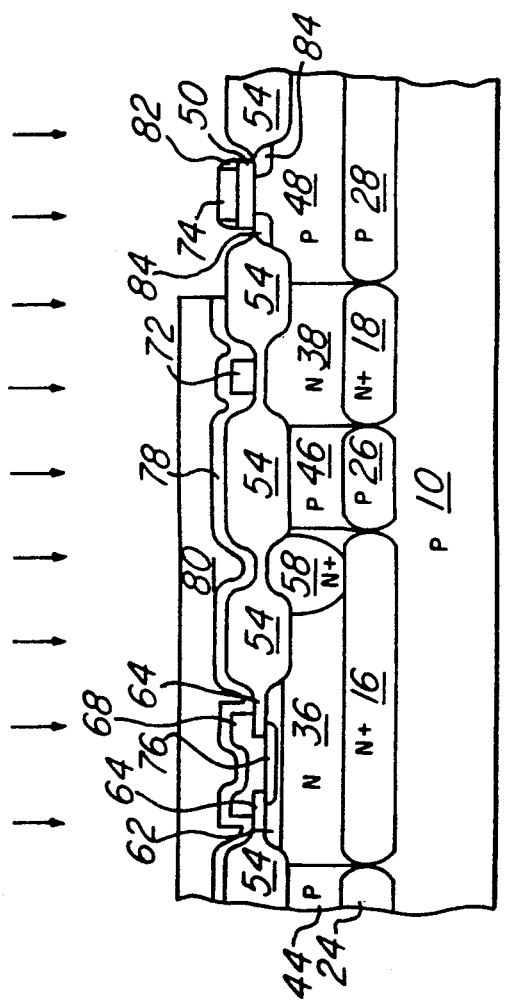
Fig. 13b
Fig. 14a

HIGH VOLTAGE BIPOLAR TRANSISTOR IN BICMOS

This application is a division of application Ser. No. 07/496,396, filed 03/20/90, now abandoned.

FIELD OF THE INVENTION

The present invention relates to the field of integrated circuit fabrication. More specifically, the present invention relates to the field of device formation in bipolar/-complementary field effect integrated circuits.

BACKGROUND OF THE INVENTION

The combination of bipolar transistors with complementary field effect transistors is an appealing combination. Bipolar transistors can switch at much higher rates of speed than field effect transistors. However, bipolar transistors consume much more power than field effect transistor devices and a great deal more power than complementary-type field effect transistor circuits.

Some access in fabricating this type of circuit has been accomplished. For example, Tran, et al., "An 8 ns BiCMOS 1 Mb ECL SRAM with a Configuration Memory Array Size", ISSCC 89 pages 36 and 37, shows a 1 Mb SRAM using BiCMOS technology. However, because of the constraints of fabricating bipolar transistors and field effect transistors, usually metal oxide semiconductor type transistors, the transistor types are limited to a few specific types of transistors and the processing steps are extraordinarily complex. For example, bipolar transistor capable of withstanding high voltage operation are difficult to fabricate because of the very specific doping levels available to fabricate transistor components and provide high quality, high speed bipolar transistors and MOS devices.

SUMMARY OF THE INVENTION

The described embodiments of the present invention show a high voltage bipolar transistor integrated into a bipolar complementary metal oxide semiconductor integrated circuit. The high voltage transistor is fabricated using the available processing steps for fabricating other components in more standard BiCMOS process. The collector of the transistor is formed using a buried N type region in a P substrate. A P well, rather than the conventional N well is formed above the buried N layer. The collector contact to the buried N layer is fabricated so as to surround the P well to provide a separate base region. A highly doped P type base region is formed with a P+ contact to this region. An N+ emitter is formed by out diffusion from a heavily doped polycrystalline silicon layer formed in contact with the base region. By providing the lightly doped P well as an interface between the collector and the base, the breakdown voltage of the collector/base junction is substantially raised and thus the breakdown voltage from the collector to the emitter is also raised. A transistor thus fabricated is appropriate for high voltage applications.

DESCRIPTION OF THE DRAWINGS

FIGS. 1A through 15A are side view schematic diagrams depicting the processing steps necessary to fabricate a BiCMOS integrated circuit awncorporating aspects of the present invention; and FIGS. 6B through 11B, 13B and 15B are side view schematic drawings showing the processing steps necessary to fabricate the high voltage transistor which is one embodiment of the present invention, FIGS. 6B through 11B, 13B and 15B parallel the fabrication steps of the process shown in FIGS. 1A through 15A showing the differences in use of those processing steps to fabricate the described embodiment.

DETAILED DESCRIPTION

Figure 3A:
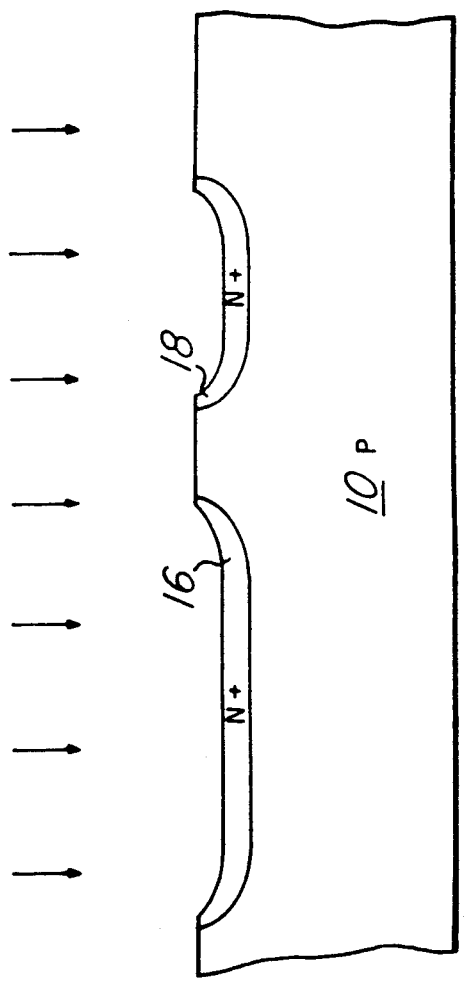

FIGS. 1A through 15A are side view schematic diagrams depicting the processing steps necessary to fabricate a BiCMOS integrated circuit incorporating aspects of the present invention. FIGS. 6B through 11B, 13B and 15B are side view schematic drawings showing the processing steps necessary to fabricate the high voltage transistor which is one embodiment of the present invention, FIGS. 6B through 11B, 13B and 15B parallel the fabrication steps of the process shown in FIGS. 1A through 15A showing the differences in use of those processing steps to fabricate the described embodiment.

Referring to FIG. 1A, the starting material for the described fabrication processes is <100> oriented crystalline silicon doped to P− type. This is substrate 10 as shown in FIG. 1A. A layer of silicon dioxide 12 is formed on the surface of substrate 10 by thermal oxidation in a $O_2$ ambient at a temperature of approximately 900° C. for approximately 250 minutes. A layer of silicon nitride is then formed on the top of silicon dioxide layer 12 using low pressure chemical vapor deposition to a thickness of approximately 1,000. Silicon dioxide layer 12 and silicon nitride layer 14 are then patterned using common photolithographic techniques to provide the structure shown in FIG. 1A. The structure of FIG. 1A is then subjected to an ion implantation of N type ions, such as antimony ions, having an energy of approximately 40 to 60 Kiloelectron-Volts at a density of approximately $3 \times 10^{15}$ ions/cm$^2$. This ion implantation provides N type regions 16 and 18 as shown in FIG. 1A. The structure of FIG. 1A is then subjected to thermal oxidation in an $N_2O_2$ ambient for approximately 30 minutes at a temperature of approximately 1250° C. This oxidation step provides thick oxide regions 20 and 22 as shown in FIG. 2A. In addition, N+ doped region 16 ad 18 are driven into substrate 10 and annealed.

Silicon dioxide layer 20 is then removed using a $HF_2$ etchant. The remaining structure, as shown in FIG. 3A is then subjected to an ion implantation of boron ions having an energy of approximately 160 Kiloelectron-Volts and a density of approximately $4 \times 10^{12}$ ions/cm$^2$. This ion implantation forms P regions 24 26 and 28 as shown in FIG. 3A. The surface of the structure of FIG. 3A is planarized and an intrinsic silicon epitaxial layer 30 is then formed on the surface of substrate 10. The remaining structure is shown in FIG. 4A.

A process for forming buried doped regions 15, 18, 24, 26 and 28 providing higher planarity and an improved structure may be found in copending U.S. application Ser. No. 265,074 filed Oct. 31, 1988 and assigned to the assignee of this application. Ser. No. 265,074 is hereby incorporated by reference.

Figure 4A:
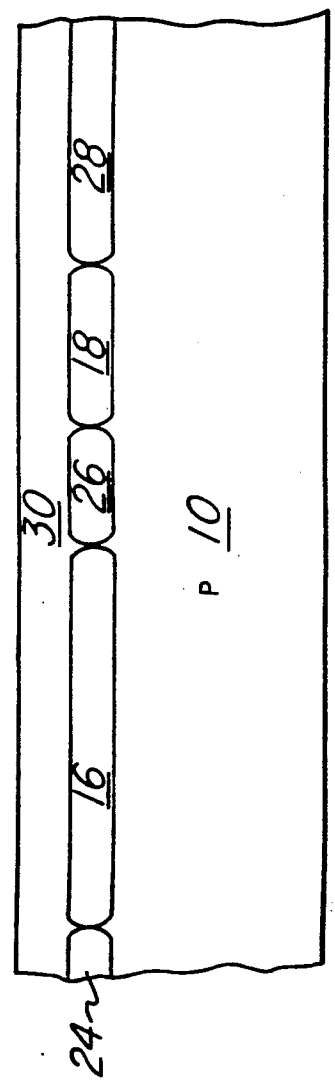
Figure 5A:
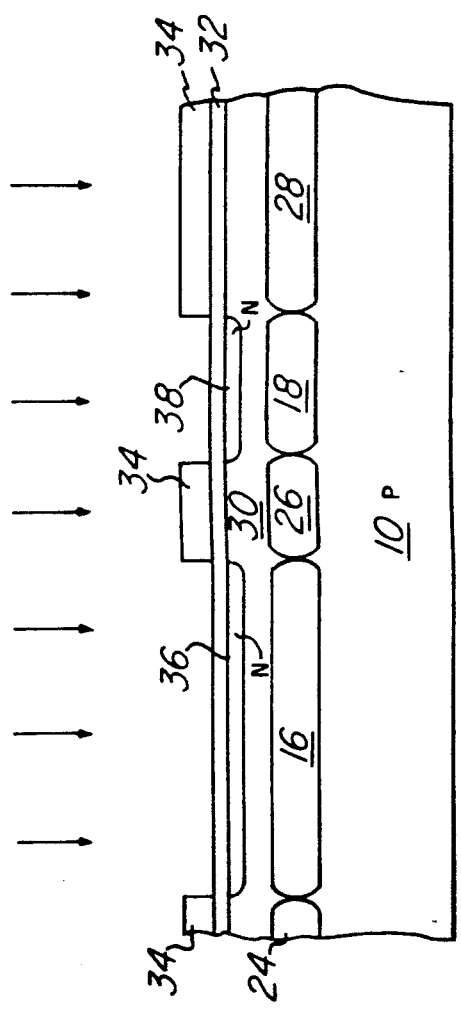

Silicon dioxide layer 32 is formed on the surface of the structure of FIG. 4A by thermal oxidation in a $O_2$ ambient for approximately 60 minutes at a temperature of approximately 900° C. This structure is shown in FIG. 5A. Silicon nitride layer 34 is then formed to a thickness of approximately 1000 using low pressure chemical vapor deposition. Silicon nitride layer 34 is then patterned using common photolithographic techniques to provide the structure as shown in FIG. 5A. The structure of FIG. 5A is then subjected to an ion implantation of Arsenic ions having an energy of approximately 70 Kiloelectron-Volts and 350 Kiloelectron-Volts both having a density of approximately $2.2 \times 10^{12}$ ions/cm$^2$. This ion implantation forms N regions 36 and 38 as shown in FIG. 5A.

Figure 6A:
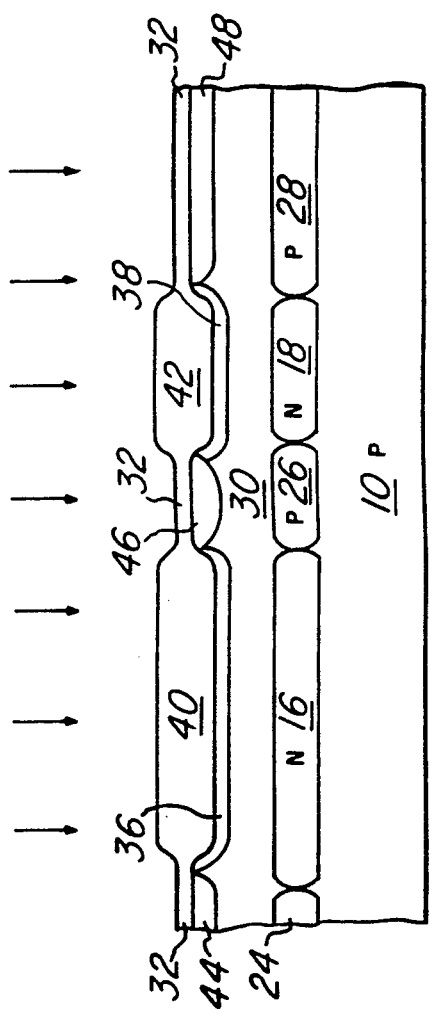

The structure of FIG. 5A is then subjected to thermal oxidation in a steam ambient for approximately 190 minutes at approximately 900° C. This forms thick oxide regions 40 and 42 as shown in FIG. 6A. The structure of FIG. 6A is then subjected to an ion implantation of boron ions having an energy of approximately 50 Kiloelectron-Volts and a density of approximately $1 \times 10^{12}$ ions/cm$^2$. This ion implantation forms P regions 44, 46 and 48 as shown in FIG. 6A. The surface of the structure of FIG. 6A is planarized and diffusions 36, 38, 44, 46, and 48 are driven in using an annealing step at a temperature of approximately 1000° C. for approximately 250 minutes in an O$_2$ ambient. The resulting structure is shown in FIG. 7A.

Figure 6B:
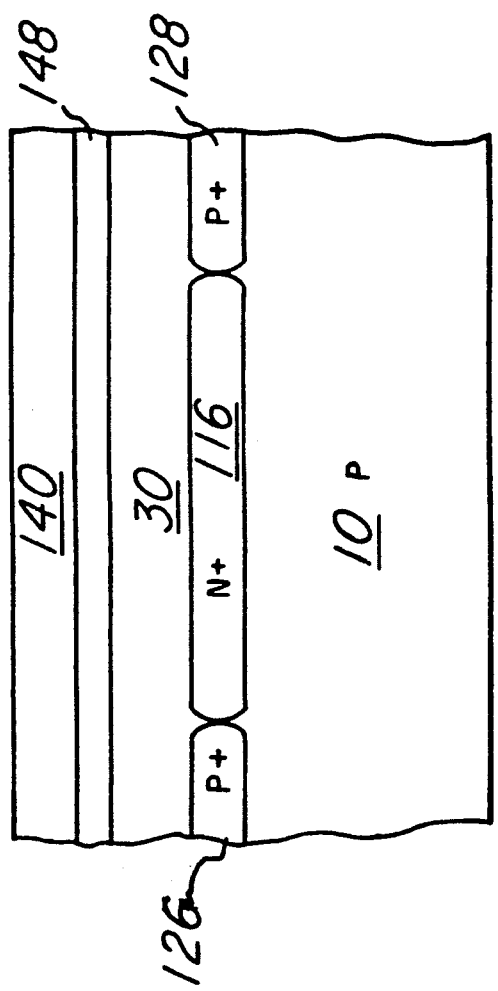

Up until this stage, the processing steps necessary to fabricate the high voltage transistor which comprises one embodiment of the present invention have been identical to the steps shown with regard to FIG. 1A through FIG. 5A. As shown in FIG. 6B, N+ region 116 is formed using the same process described with regard to N region 16 of FIG. 6A. Similarly, P+ region 126, P+ region 128, epitaxial layer 30, P region 148 and oxide layer 140 are fabricated using the same processing steps used to fabricate P region 26, P region 28, epitaxial layer 30, P region 48 and silicon dioxide layer 40 shown with regard to FIGS. 1A through 6A. However, note that P region 148 is formed above buried N+ layer 116. P region 148 of FIG. 6B is driven in to form P region 148, as shown in FIG. 7B using the same annealing step used to drive in diffusions 36, 38, 44, 46, and 48.

Figure 7A:
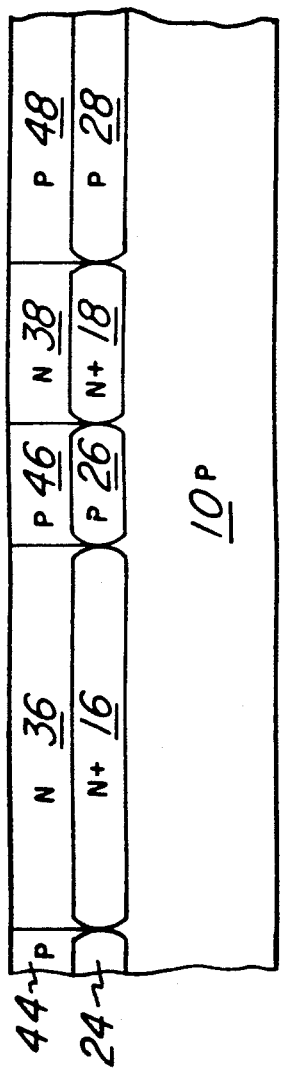
Figure 7B:
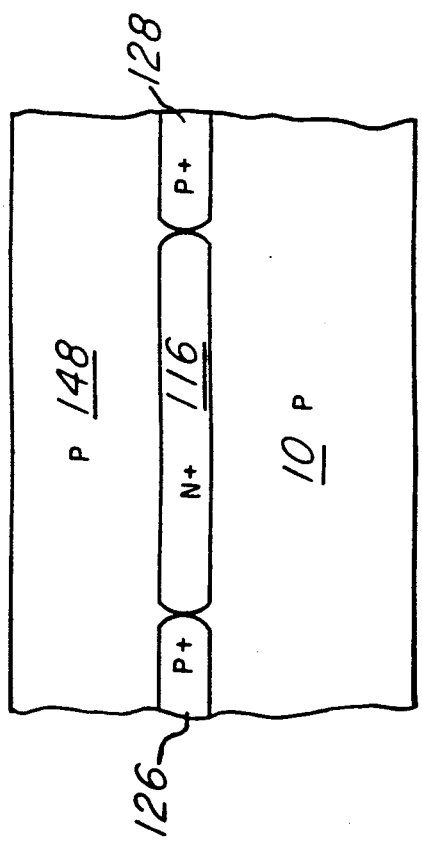

A thin silicon dioxide layer 50 is then grown on the surface of the structure of FIG. 7A using thermal oxidation in a O$_2$ ambient as shown in FIG. 8A. A layer of silicon nitride 52 is formed on the surface of silicon dioxide layer 50 and patterned to provide the structure shown in FIG. 8A. This structure is then subjected to a thermal oxidation step in a O$_2$ ambient at approximately 900° C. for approximately 500 minutes to form silicon dioxide regions 54 to a thickness of approximately 7000 as shown in FIG. 8A. Silicon dioxide layer 50 and silicon nitride layer 52 are also formed on the structure of FIG. 7B. Silicon nitride layer 52 is patterned to provide patterned silicon nitride layer 52 as shown in FIG. 8B. Using the same thermal oxidation steps used to form thick silicon dioxide regions 54, as shown in FIG. 8A, silicon dioxide regions 54, as shown in FIG. 8B, are formed.

Figure 9A:
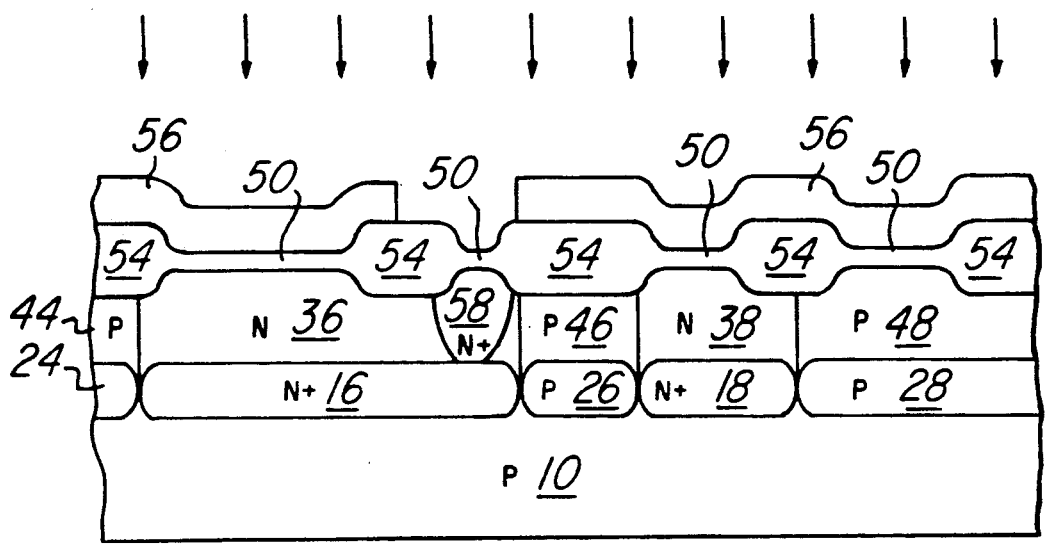
Figure 9B:
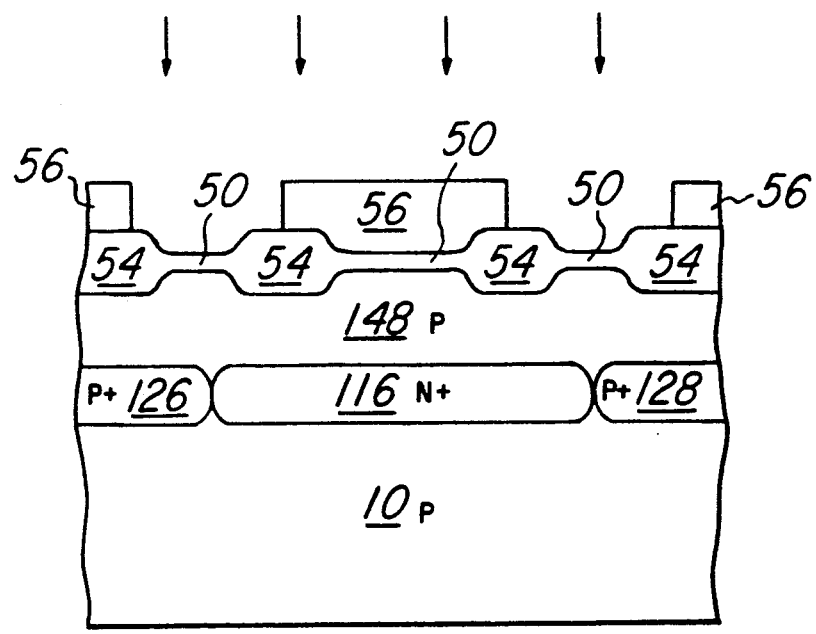
Figure 10A:
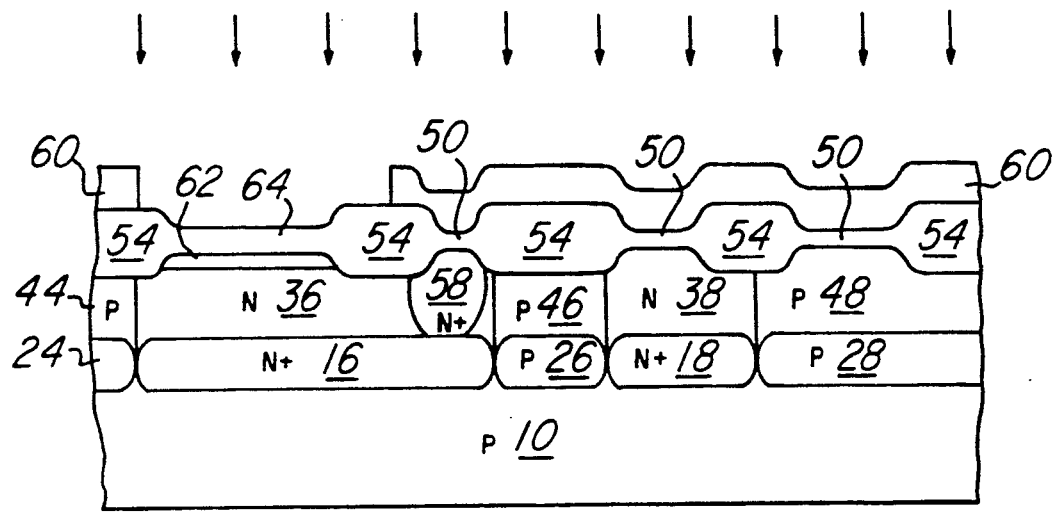
Figure 10B:
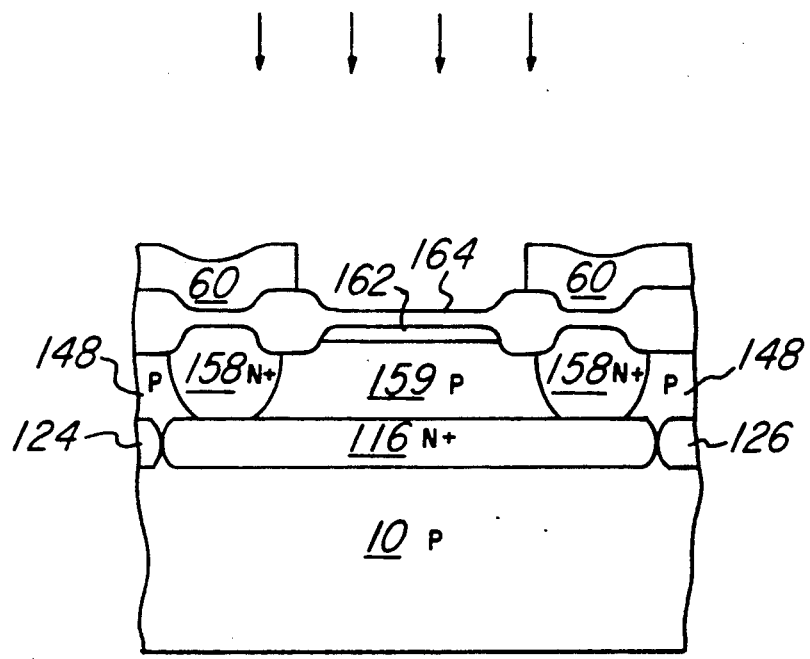
Figure 11A:
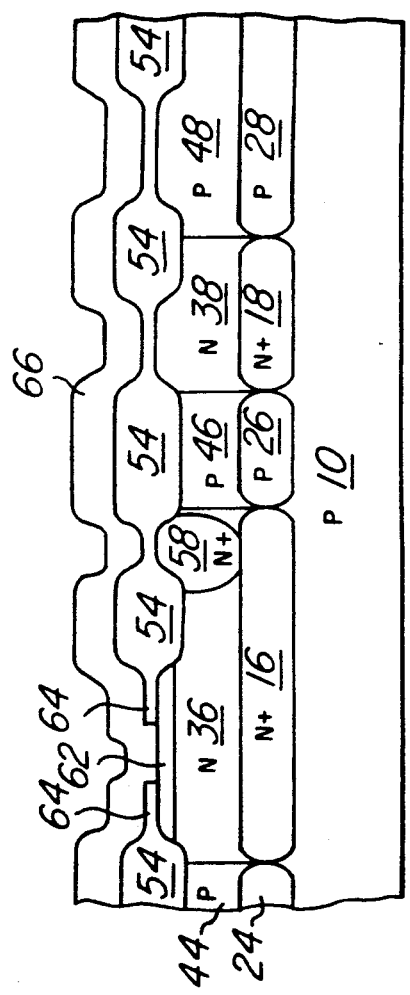
Figure 11B:
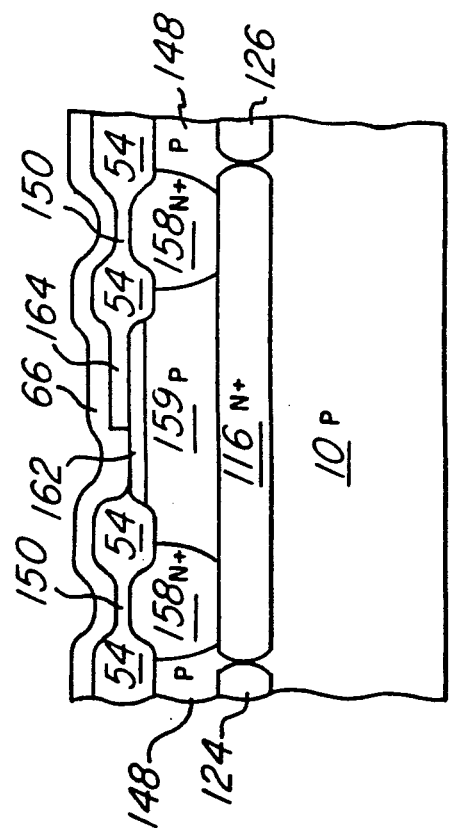

Silicon nitride layer 52 is removed using wet chemical etching in phosphoric acid. A layer of photoresist 56 is then formed on the surface of the structure of GI. 8A as shown in FIG. 9A. Photoresist layer 56 is also formed and patterned, as shown in FIG. 9B. Photoresist layer 56 is selected to a thickness sufficient to provide a thick ion implantation mask for the implantation of arsenic ions at an energy of approximately 150 Kiloelectron-Volts having a density of approximately $1 \times 10^{16}$ atoms/cm$^2$. This ion implantation forms, when annealed, N+ contact region 58 as shown in FIG. 9A. The ion implantation and anneal also forms collector contact 158, as shown in FIG. 10B. Collector contact 158 is implanted so that collector contact 158 completely surrounds P well 159 and isolates P well 159 from P regions 148. P regions 148 provide electrical isolation of collector contact 158 from other devices formed adjacent to the transistor formed in FIGS. 6B through 11B, 13B and 15B.

Photoresist layer 56 is then removed using common liquid removal techniques. Silicon nitride layer 60 is then formed on the surface of the structure of FIG. 9A as shown in FIG. 10A. Silicon nitride layer 60 is patterned and etched to expose the surface of silicon dioxide layer 50 above N well 36. This structure is subjected to an ion implantation of boron ions having a density of approximately $6 \times 10^{13}$ ions/cm$^2$ and an energy of approximately 40 Kiloelectron-Volts. Silicon dioxide layers 64 and 164 are then grown using thermal oxidation at a temperature of approximately 1000 degrees in a O$_2$ atmosphere for approximately 100 minutes. Silicon dioxide layers 64 and 164 are grown to a thickness of approximately 1400. This is annealed to form base region 62 as shown in FIG. 10A. As base region 62 is formed, base region 162 is also formed as shown in FIG. 10B.

Silicon nitride layer 60 is then removed using wet chemical etching in phosphoric acid. A photomask (not shown) is then formed and patterned to expose a portion of silicon dioxide layer 64. The exposed portion of silicon dioxide layer 64 is then removed using reactive ion etching. The photomask (not shown) is then removed and a layer of polycrystalline silicon 66 is formed on the surface of the structure of FIG. 11A. Polycrystalline silicon layer 66 is doped with N+ + type using one of several optional techniques, such as ion implantation, in situ doping, or any other suitable technique. The photomask (not shown) is also used for patterning and etching silicon dioxide layer 164 to provide the structure of FIG. 11B. Polycrystalline silicon layer 66 is deposited on the surface of the structure of FIG. 11B and doped as described with regard to FIG. 11A.

Figure 12A:
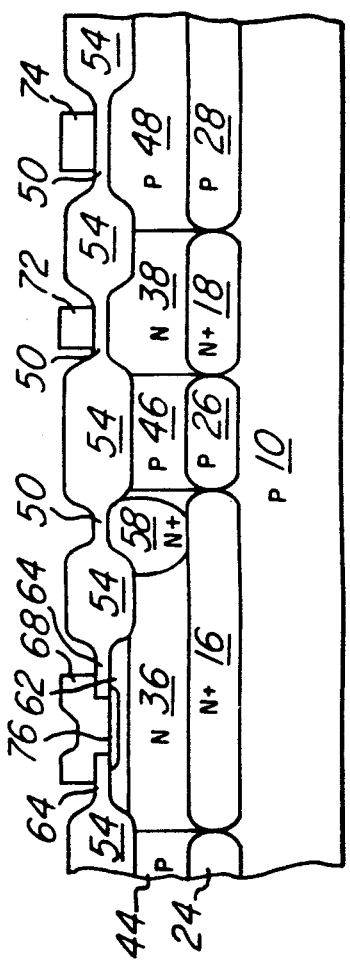

Polycrystalline silicon layer 66 is then patterned to provide base contact 68, gate 72 and gate 74 as shown in FIG. 12A. In the process, a portion of the doping from polycrystalline silicon layer 66 diffuses into the surface of substrate 10 at P region 62 to form N+ + emitter 76. As N+ base region 76 was driven in so base region 176 is driven in during the same step. Polycrystalline silicon layer 66 is patterned to provide emitter contact 168 and collector contact 170 as shown in FIG. 13B.

Figure 13A:
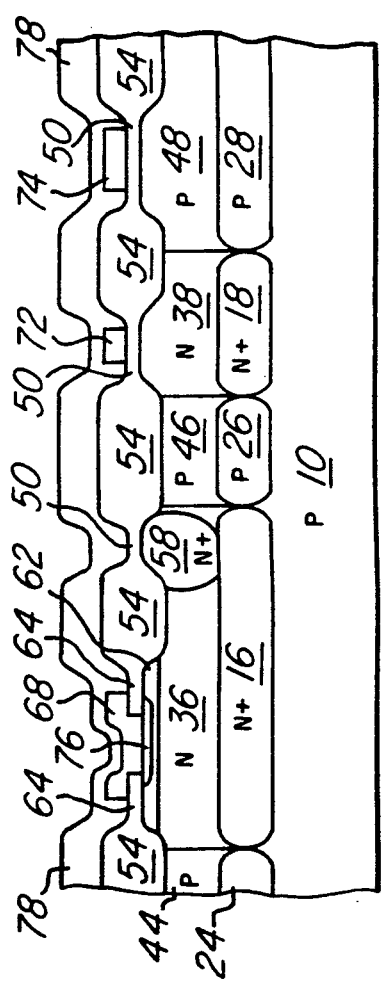

A layer of silicon dioxide 78 is then formed on the surface of the structure of FIG. 12A using chemical vapor deposition to a thickness of approximately 1,000 as shown in FIGS. 13A and B. A suitable etching mask 80, comprising a material such as silicon nitride is formed on the surface of silicon dioxide layer 78. Etch mask 80 and silicon dioxide layer 78 are patterned and etched to expose the surface of P well 48 which is not covered by gate 74. The removal of etch mask 80 and silicon dioxide layer 78 is conducted by anisotropic etching using reactive ion etching and a CHF$_3$ etchant. Thus, a portion of silicon dioxide layer 78 will remain as sidewall oxide layers 82. An ion implantation of Arsenic is then performed having an energy of 150 Kiloelectron-Volts and a density of approximately $3 \times 10^{15}$ ions/cm$^2$. This ion implantation is then annealed to form source drain regions 84 as shown in FIG. 14A.

Figure 15A:
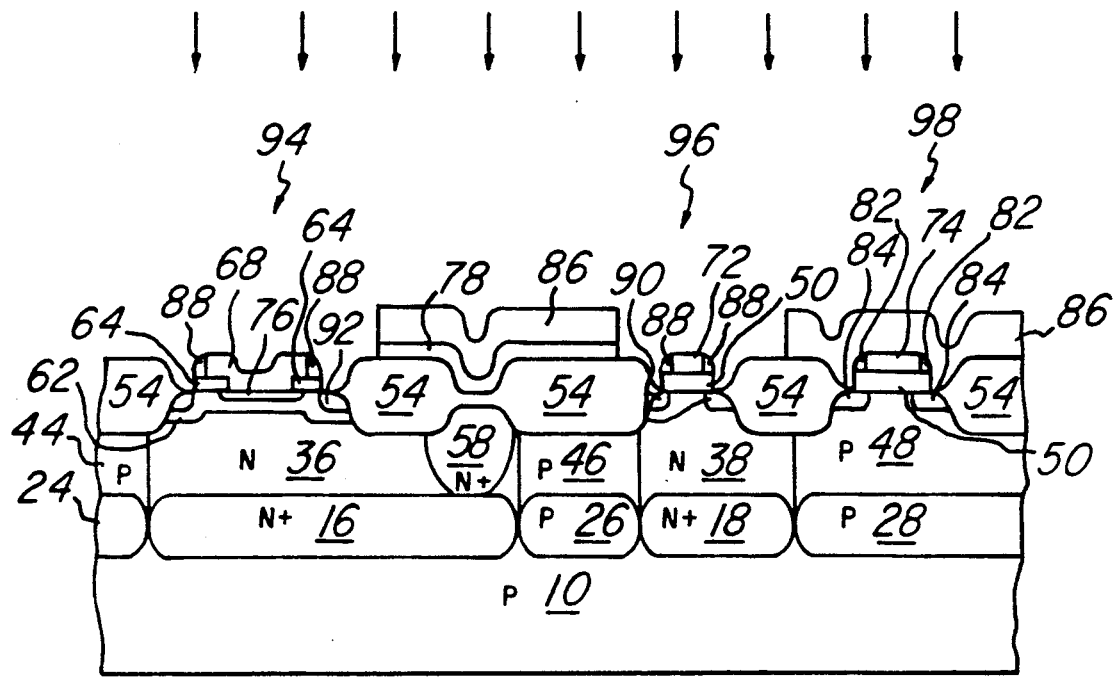
Figure 15B:
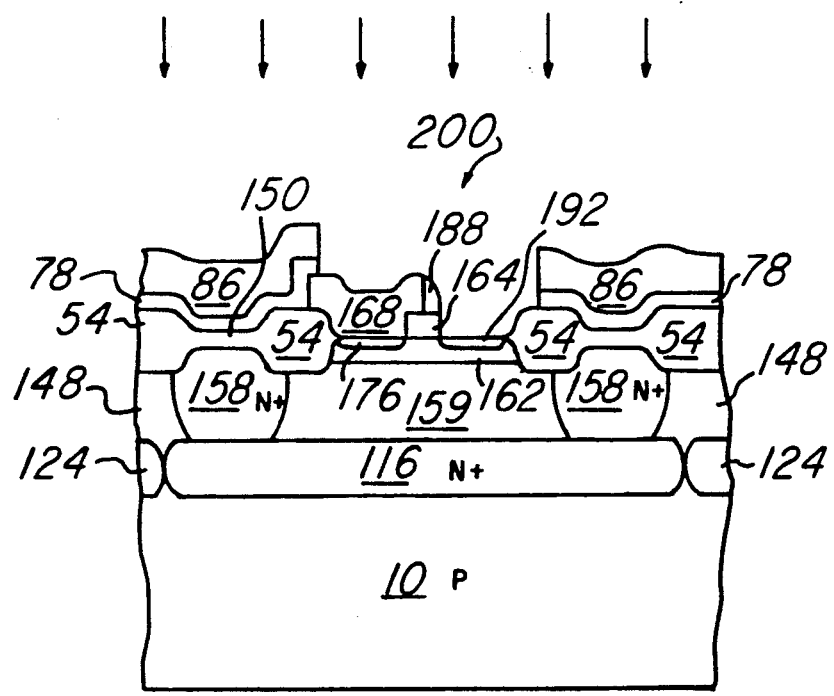

Etch mask 80 is then removed and a second etch mask 86 is formed as shown in FIGS. 15A and B. Etch mask 86 is then patterned using common photolithographic techniques to provide the structure for etch mask 86 as shown in FIG. 15A and B. Etch mask 86 is then used to etch silicon dioxide layer 78 and silicon dioxide layers 50, 150, 64 and 164 to expose the surfaces of N wells 36 and 38 and P well 159 where not covered by the structure of emitter contact 68, gate 72 and emitter contact 168 or etch mask 86. The structure of FIGS. 15A and B is then subjected to an ion implantation of boron ions having an energy of approximately 20 Kiloelectron-Volts and a density of approximately $3 \times 10^{15}$ ions/cm$^2$. This forms P+ source drain regions 90 and base contact regions 92 as shown in FIG. 15A and P+ base contact region 192 and shown in FIG. 15B. In addition, because the etching of silicon dioxide layer 78 is performed using an anisotropic process, sidewall oxide regions 88 and 188 remain on the sides of base contact 68 and gate 72.

Thus NPN transistor 94, P channel transistor 96, N channel transistor 98 and NPN transistor 200 are fabricated. Additional steps such as silicidation of the surfaces of base contact 68, gates 72 and 74, source drain regions 84, source drain regions 90, and base contact regions 92 and 192 may be performed to provide better conductivity for the resulting structure.

Because P well 159 has a lower doping level than base region 162, the junction between P well region 159 and buried collector 116 and collector contact 158 is thicker and has more resistance to high voltage breakdown. This is due to the wider depletion regions formed at the interface between lower doped regions. Therefore, the collector to emitter breakdown voltage of transistor 200 is greater than the collector to emitter breakdown voltage of transistor 94 in FIG. 15A. In addition, high voltage transistor 200 is formed using no additional fabrication steps over those for forming transistors 94, 96 and 98.

Although specific embodiments of the present invention are herein described, they are not to be construed as limiting the scope of the invention. The scope of the invention is only limited by the claims appended hereto.

What is claimed is:

1. A process for forming bipolar transistors and complementary field effect transistors in a common substrate, comprising the steps of:

providing said substrate having a P conductivity type and having an N-channel transistor area, a P-channel transistor area and a bipolar transistor area;

forming buried N type layers spaced from a surface of said substrate in said P-channel transistor area and said bipolar transistor area;

forming a buried P type layer spaced from said surface of said substrate in said N-channel area;

forming an N well in said P-channel transistor area extending from said buried N type layer to said surface;

forming P wells in said N-channel transistor area and said bipolar transistor area, said P well extending from said buried P type layer in said N-channel transistor area to said surface and said P well extending from said buried N type layer in said bipolar transistor area to said surface;

forming a P base contact region and a P source and P drain by introducing dopant atoms into said P well in said bipolar transistor area and into said N well of said P-channel transistor area;

forming an N emitter in said bipolar transistor area by introducing dopant atoms into said P well in said bipolar transistor area;

forming an N source and an N drain in said N-channel transistor area by introducing dopant atoms into said P well in said N-channel transistor area; and forming gates controlling conduction between said sources and drains in said N-channel transistor area and said P-channel transistor area, 2. A process as in claim 1 wherein said substrate comprises crystalline silicon.

3. A process as in claim 1 wherein said gates are separated from said substrate by insulating layers.

4. A process as in claim 1 wherein said buried N type layers are formed by implanting dopant ions into the surface of said substrate; and forming an epitaxial layer on said surface of said substrate.

5. A process as in claim 1 wherein said buried P type layer is formed by implanting dopant ions into the surface of said substrate; and forming an epitaxial layer on said surface of said substrate.

6. A process as in claim 4 wherein said N well is formed by implanting dopant ions into said epitaxial layer.

7. A process as in claim 4 wherein said P well is formed by implanting dopant ions into said epitaxial layer.

8. A process as in claim 5 wherein said N well is formed by implanting dopant ions into said epitaxial layer.

9. A process as in claim 5 wherein said P well is formed by implanting dopant ions into said epitaxial layer.

* * * * *